United States Patent [19]
Landis

[11] Patent Number: 5,860,805
[45] Date of Patent: Jan. 19, 1999

[54] EFFLUENT-GAS-SCAVENGER SYSTEM FOR PROCESS TUBE, MINIMIZING BACK DIFFUSION AND ATMOSPHERIC CONTAMINATION

[75] Inventor: Donald G. Landis, Hollis, N.H.

[73] Assignee: Lansense, LLC, Hollis, N.H.

[21] Appl. No.: 999,506

[22] Filed: Dec. 29, 1997

[51] Int. Cl.[6] ....................................................... F27B 5/04

[52] U.S. Cl. .......................... 432/205; 432/152; 432/253

[58] Field of Search ..................................... 432/152, 205, 432/253, 5, 6, 11

[56] References Cited

U.S. PATENT DOCUMENTS

| | | | |
|---|---|---|---|
| 4,976,610 | 12/1990 | Yates | 432/11 |
| 5,118,286 | 6/1992 | Sarin | 432/2 |

Primary Examiner—Teresa Walberg
Assistant Examiner—Jiping Lu
Attorney, Agent, or Firm—Robert G. Crooks

[57] ABSTRACT

A dual-function scavenger system, especially useful in conjunction with ovens for processing semiconductor materials, wherein the spent process gases from the ovens are separated from their residual thermal energy for disposition through discrete channels. Back diffusion of atmospheric air into the ovens is minimized.

27 Claims, 8 Drawing Sheets

EFFLUENT-GAS-SCAVENGER SYSTEM FOR PROCESS TUBE, MINIMIZING BACK DIFFUSION AND ATMOSPHERIC CONTAMINATION

BACKGROUND OF THE INVENTION

1. Field of the invention

This invention relates to an effluent-gas-scavenger system especially adapted for use with a process tube wherein multiple wafers of semiconductor material are treated with gases and additives sequentially introduced to the tube under closely-controlled conditions of pressure and of high temperature. Each "charge" of semiconductor material is very valuable and must be processed with precisely-controlled quantities of gases and additives, some of which may be toxic. Accordingly, safe and efficient disposition must be made of the spent gases which exit the process tube after passing the charge of semiconductor material. Moreover, it is important to minimize any "back diffusion" of air or other ambient gas or pollution from the environment of the process tube upstream into the exit portal of the process tube and thence into contact with any of the charge of semiconductor material.

2. Description of the Prior Art

U.S. Pat. No. 5,118,286—Sarin shows an apparatus for preventing exhausted reactant gas, derived from a semiconductor-process tube, from mixing with ambient air in the vicinity of the process tube. That patent discloses the use of an exhaust gas tube for drawing off exhausted reactant gas from an inlet near the downstream end of the process tube and for conveying the exhausted gas through a control valve to a gas scrubber. A closed loop system is provided for controlling the valve to maintain a predetermined small differential between the gas pressure near the downstream end of the process tube and the pressure of the ambient air just outside the end of the process tube.

In the apparatus of Sarin, the heat content of the exhausted reactant gas goes with it through the exhaust gas tube to the scrubber. There is no provision for substantially removing the heat content of the exhausted reactant gas for separate disposition. Nor is it explained how a seal can be maintained between the exhaust tube 30 and inlet 30A, on the one hand, and the process tube 12, on the other. The latter must operate at a very high temperature, and would resist the formation of a tight and permanent seal with any other body.

U.S. Pat. No .4,976,610—Yates discloses the use of a movable quartz "elephant tube" (process tube) 12, to which is connected a return scavenger exhaust tube 34 for feeding back the reactant gas to the jacket around elephant tube 12. No means is provided for removing surplus heat from the exhausted reactant gas and for separately disposing of such surplus heat. It is not apparent how backstreaming exhausted reactant gas is prevented from contaminating the charge of semiconductor material in the elephant tube.

SUMMARY OF THE INVENTION

In view of the shortcomings of the aforementioned and other prior art, my invention provides a scavenger system for use in conjunction with a semiconductor process tube or other reactor vessel in which process gas is passed over a charge at high temperature. Typically, although not necessarily, the process gas enters an upstream end of the process tube and exits the downstream end through a restricted port such as a door loosely but not sealingly juxtaposed against an opening in the downstream end of the process tube. In passing over the charge, the process gas becomes spent, and may include constituents which are poisonous or corrosive and all of which are very hot.

In the scavenger system of my invention, residual thermal energy is separated from the spent process gas and is disposed of by means separate and distinct from the means employed in disposing of the gas itself, which may be contaminated and noxious. Thus the residual heat and the noxious gas are put out of the way in different fashions because they raise different problems. The system deals with those problems separately, each in the most suitable way for that respective problem. The spent process gas is kept isolated from the ambient atmosphere and is exhausted to a dedicated effluent-management system. The excess thermal energy, on the other hand, is exhausted to a simple air-handling system for reclamation and recirculation or for disposition.

The scavenger system in accordance with my invention includes a scavenger enclosure, typically of corrosion-resistant metal, having a flange which embraces and makes "soft" or porous contact with the periphery of the process tube. It also includes a door having another soft or porous seal between itself and the downstream end of the process tube to minimize interchange between the spent process gas and the ambient atmosphere of the room which accommodates the process tube and scavenger. Still further, the system includes a novel pressure control to insure that spent process gas always flows into the dedicated effluent-management system and not into the air-handling system.

By treating in two distinct fashions the disposition of residual heat and the disposition of spent process gas, I am able to achieve the following important advantages:

1. Back diffusion of environmental air and pollution into the process tube is minimized;
2. Spent process gas is led to its dedicated effluent-management system without being mixed with cooling air; and
3. Gas turbulence at the downstream end of the process tube is minimized, thus sharply reducing distribution of particles of contaminants.

BRIEF DESCRIPTION OF THE DRAWINGS

The invention summarized above will be described in detail in the following specification, which will be best understood if it is read while referring to the accompanying drawings, in which.

DETAILED DESCRIPTION OF THE PREFERRED MODE OF CARRYING OUT THIS INVENTION

Figure 1:
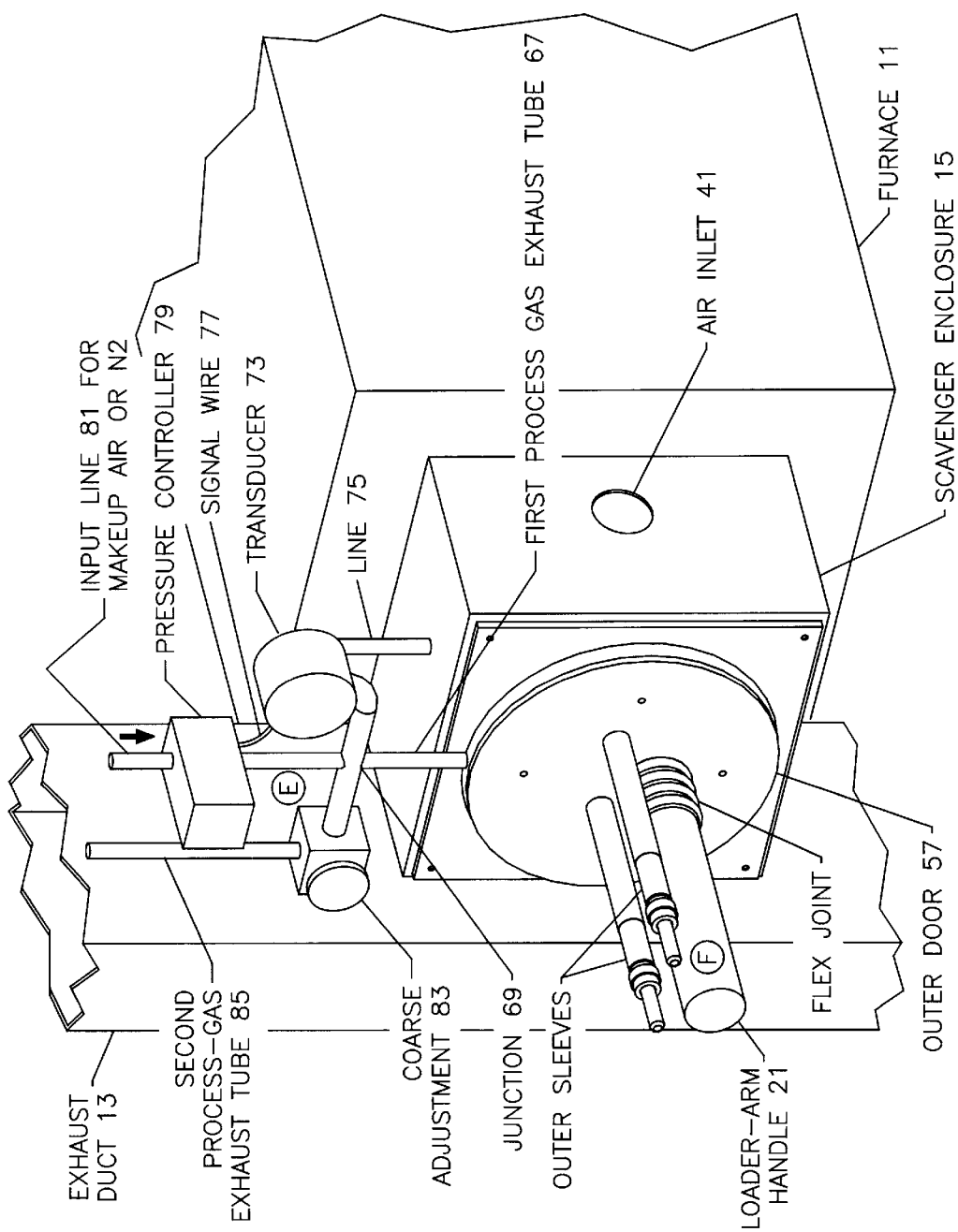
FIG. 1 is a partial perspective view of an effluent-gas-scavenger system in accordance with my invention, illustrating the relationship between the scavenger and a process furnace or other producer of effluent gas.

Referring first to FIG. 1 of the drawings, we see the overall appearance of one unitary effluent-gas-scavenger system in accordance with my invention. A furnace 11 is shown in broken-away form in order to conserve space while indicating that furnace 11 may have considerable length in a direction away from the rest of the scavenger system. An exhaust duct 13 is also shown in broken-away form in FIG. 1 and FIG. 2 in order to indicate that it may extend a considerable distance either up or down from the level of the rest of the scavenger system.

In fabrication facilities for the processing of semiconductor material, it is not uncommon to stack up to four furnaces vertically in order to save floor space. In that event, each furnace 11 may have its own scavenger enclosure 15, but each scavenger enclosure 15 may be vented through a portal 17 to a common exhaust duct 13. In a typical installation, the pressure of the gas in the common exhaust duct would be somewhat negative with respect to that of the ambient atmosphere, or with respect to the gases in the various apparatuses connected to it, which might be similar in nature or quite different. Thus, in the practice of my invention, it is assumed that the pressure in common exhaust duct 13 is a function of the type and mode of operation of the facility and has no pre-determinable value. This assumption is one of the motivating factors for the use of my invention.

Although the descriptive portion of this specification will henceforth be especially well-suited to operation with furnaces for processing of semiconductor materials, it will be understood that the invention may be practiced with other types of furnaces. In fact, the invention may be practiced with a variety of types of apparatus, other than furnaces, which generate effluent gas that must be scavenged and disposed of. One example would be a chemical reactor yielding a poisonous reaction product in hot gaseous form and having noxious particulate matter suspended therein.

Figure 5:
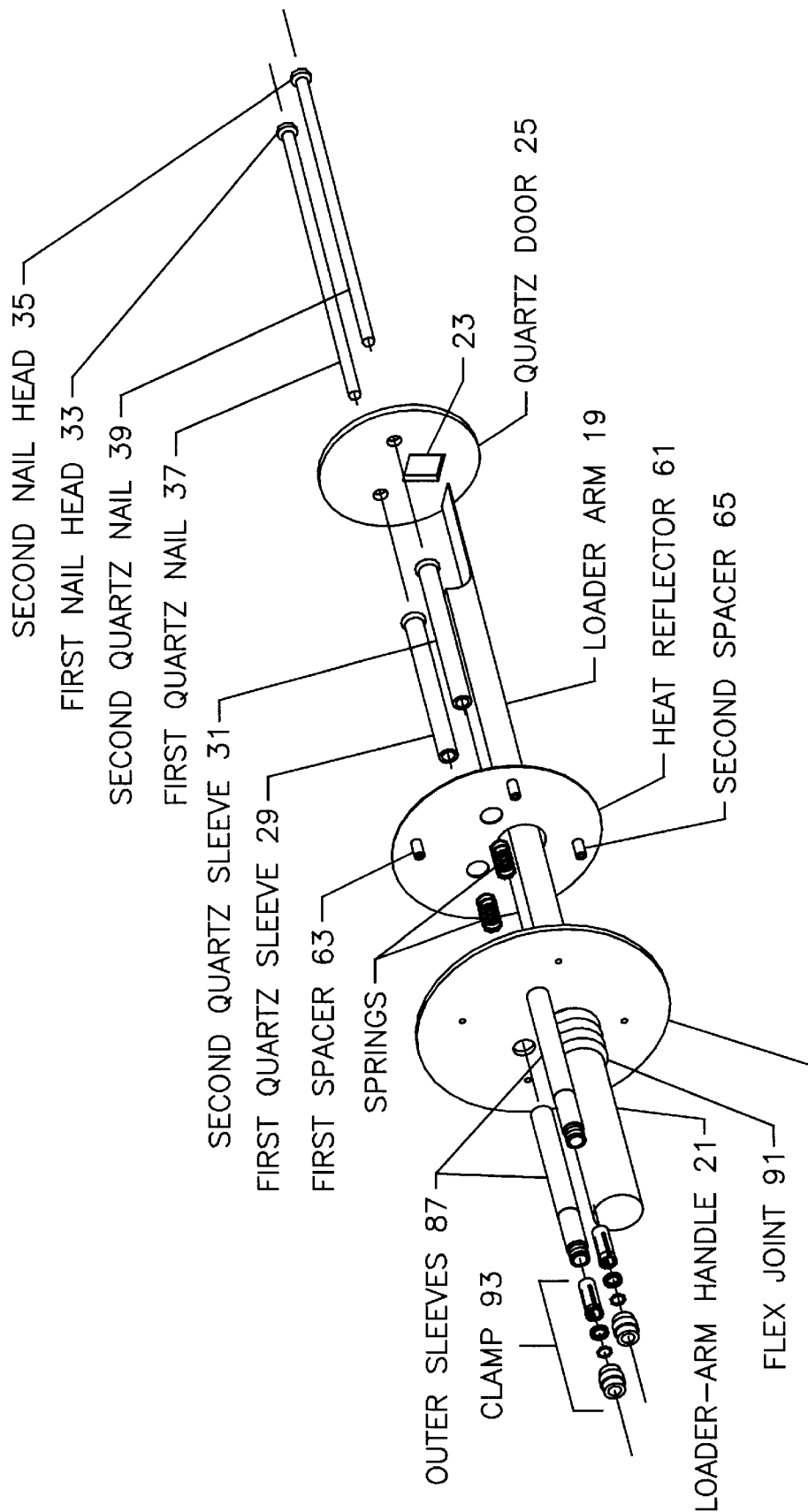
FIG. 5 is an exploded perspective view of the sub-assembly comprising the loader arm, loader-arm handle, quartz door for closing the exit of the process tube, outer door forming a part of the scavenger enclosure, heat reflector for attachment to the inner surface of the outer door, and supporting nails and sleeves for the doors and the heat reflector.
Figure 7:
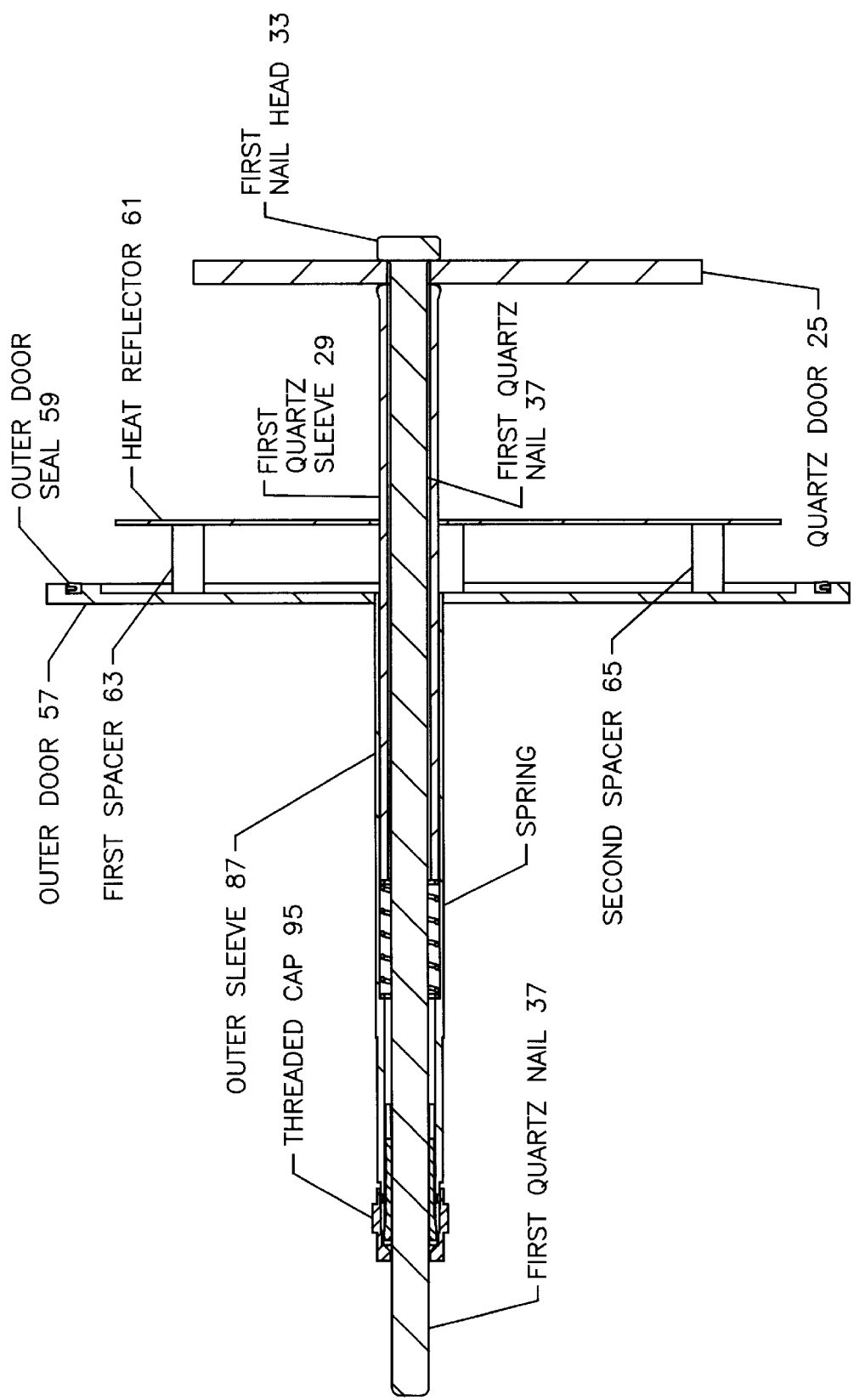
FIG. 7 is a sectional view, in elevation, of the quartz door, the heat reflector, the outer door, and a quartz nail and a sleeve which penetrate the doors for the purpose of translating the quartz door with respect to the process tube.

Assuming, for the purposes of illustration and discussion, that the facility is designed to process wafers of semiconductor material, the wafers may be supported on a "paddle" or other structure (not shown) which is an extension of a loader arm 19 having a loader-arm handle 21. As shown in FIG. 5, loader-arm handle 21 extends through a window 23 in a quartz door 25 covering the end of a quartz process tube 27 which accommodates the paddle or other structure supporting its payload of semiconductor material. The semiconductor material may, but need not necessarily, take the form of wafers stacked on the paddle or other structure like plates in a dishwasher. When the semiconductor material is being processed by the passage of gas through quartz process tube 27, quartz door 25 is pressed against the open end of quartz process tube 27 by a first quartz sleeve 29 and a second quartz sleeve 31. When processing is not taking place and semiconductor material is to be loaded into or removed from quartz process tube 27, quartz door 25 is withdrawn from the mouth of quartz process tube 27 by forces applied to its inner surface by a first nail head 33 and a second nail head 35 formed on a first quartz nail 37 and a second quartz nail 39 respectively, as shown in FIG. 5 and FIG. 7.

Furnace 11 has been shown as merely a box in the drawings because it can take any of a number of different forms in reality. In a typical semiconductor-processing configuration, the furnace "box" includes a number of electric heating elements positioned outside quartz process tube 27 and along its length. A plot of the temperature within quartz process tube 27 as a function of distance along its length could assume roughly a bell shape. The highest temperature, occurring at approximately the midpoint of the tube, would likely be in the neighborhood of 1100 degrees C. The temperatures at the ends of the tube might be about 300 degrees C. Accordingly, the payload of semiconductor material would probably be positioned near the midpoint of the tube. In order to increase the payload capacity of the tube, booster heating elements might be installed around the ends of quartz process tube 27. In that way, the payload of semiconductor material might extend nearly from one end of the tube to the other. Unfortunately, such an attempt to enlarge the "batch" of semiconductor material processed in the tube at any given time has undesirable side effects.

One undesirable side effect of attempting to maximize the processing capacity of the tube is that the effluent gas exiting the tube through the slight gap between quartz process tube 27 and quartz door 25 will contain more residual heat energy than can be vented directly to ordinary cooling and ventilating systems of the semiconductor-fabricating facility. Another undesirable side effect is the amount of back diffusion of ambient air, and perhaps pollutants, through the gap into the tube. Moreover, the turbulence of gas flow at and near the gap will be high, thus tending to increase the distribution of particulate matter outside, and especially within, the tube. All of these problems are alleviated by the scavenger system in accordance with my invention.

Figure 8:
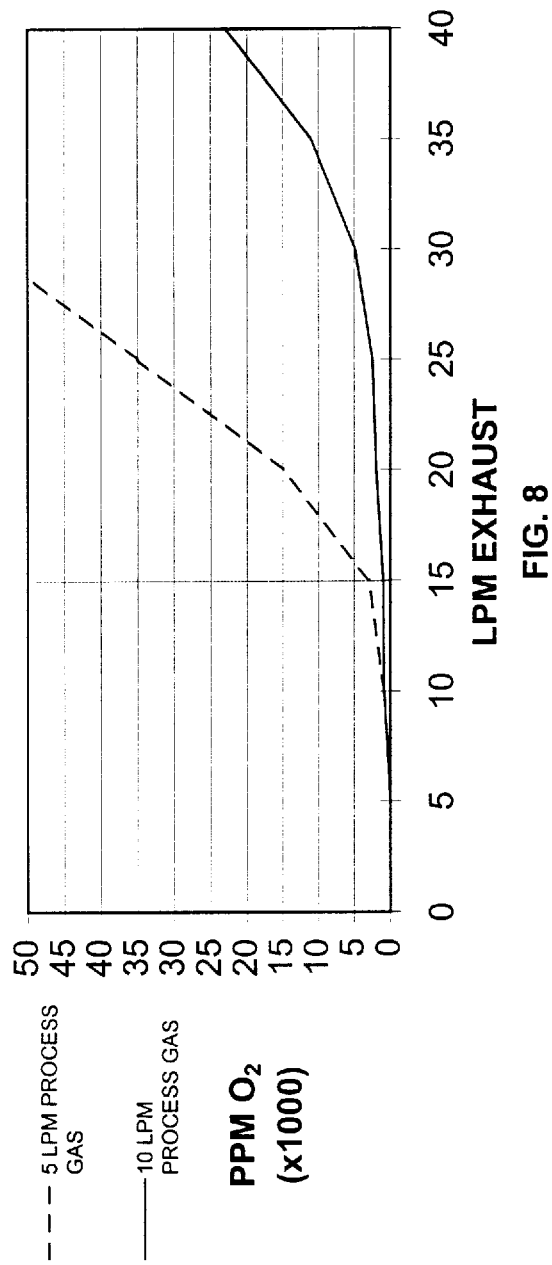
FIG. 8 is a plot, for a typical configuration of scavenger system, of the detected concentration of oxygen at a point within the process tube near its exit, as a function of volume rate of flow of process-gas exhaust for two different rates of flow of process gas.

Assuming, for the purposes of illustration, that the temperature of quartz process tube 27 near its downstream end is somewhat higher than 300 degrees C. and that the temperature of the effluent gas just outside quartz door 25 is 300 degrees C., we shall now discuss the way in which the gas is cooled and also the way in which back diffusion into the tube is minimized. The amount of back diffusion can be measured approximately by the concentration of oxygen found within the tube near its midpoint. A large number of parts per million of oxygen in the process gas indicates a high rate of back diffusion. The graphs of FIG. 8 show the concentration of oxygen molecules in the process gas as a function of the rate of process gas exhausted from the scavenger. The graphs are separately plotted for process gas flows of five liters per minute and 10 liters per minute respectively. It is noteworthy that the abscissa values of process gas exhaust from the system are much higher than the two illustrative rates of process gas flow. The reasons for this contrast will now be explained.

In an early paragraph of this detailed description, scavenger enclosure 15 has been introduced but not further characterized other than to say that it is vented through portal 17 to exhaust duct 13. It has been stated that exhaust duct 13 may receive exhaust gas from a number of furnaces and, indeed, possibly from other vessels or reactors. Hence, exhaust duct 13 may be considered to be part of the facility rather than of any particular furnace or scavenger unit.

Figure 2:
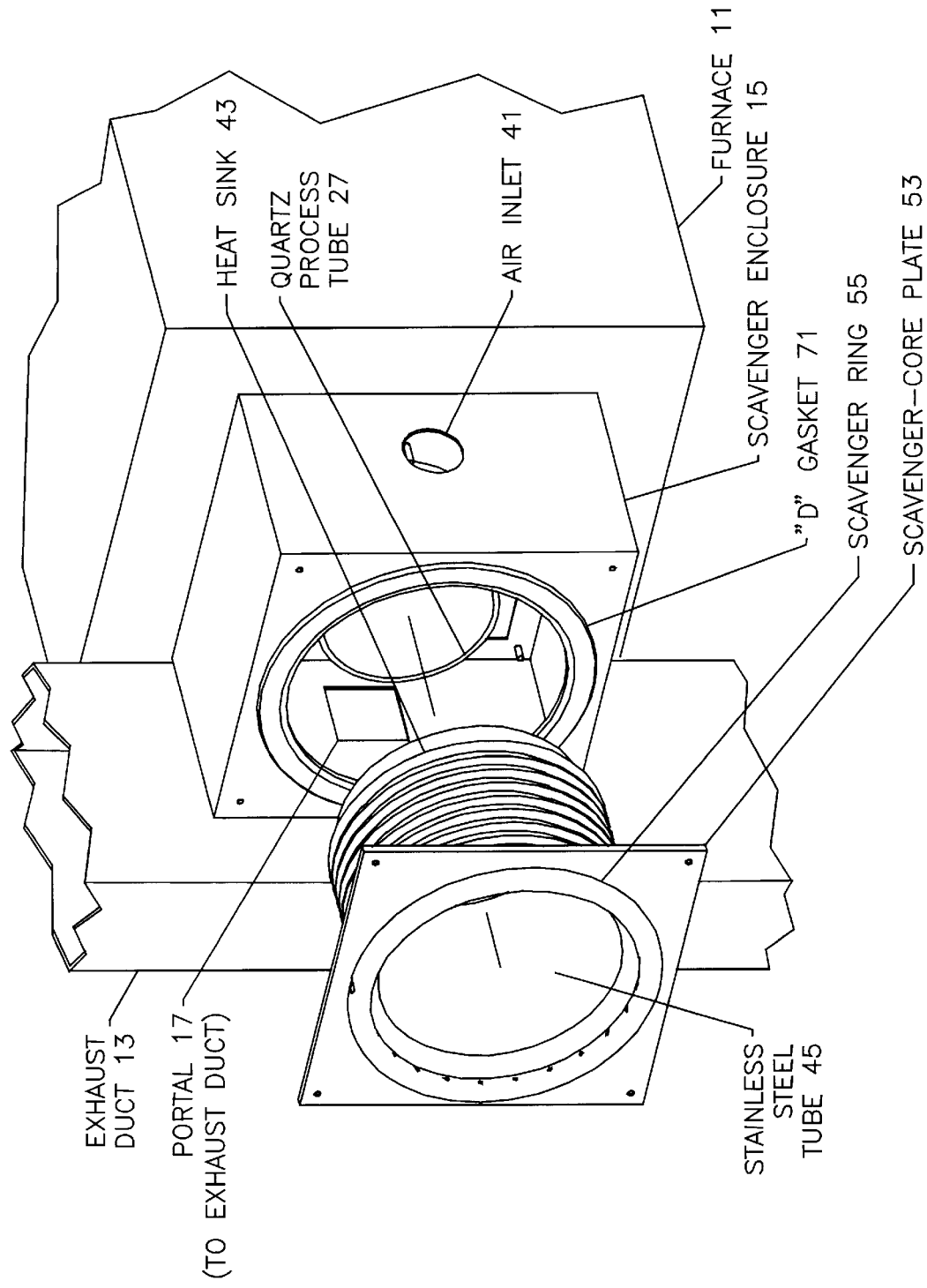
FIG. 2 is an exploded perspective view of a portion of the scavenger showing a dis-assembled representation of a heat sink for transferring heat away from effluent gas emanating from the end of a process tube within a furnace.
Figure 3:
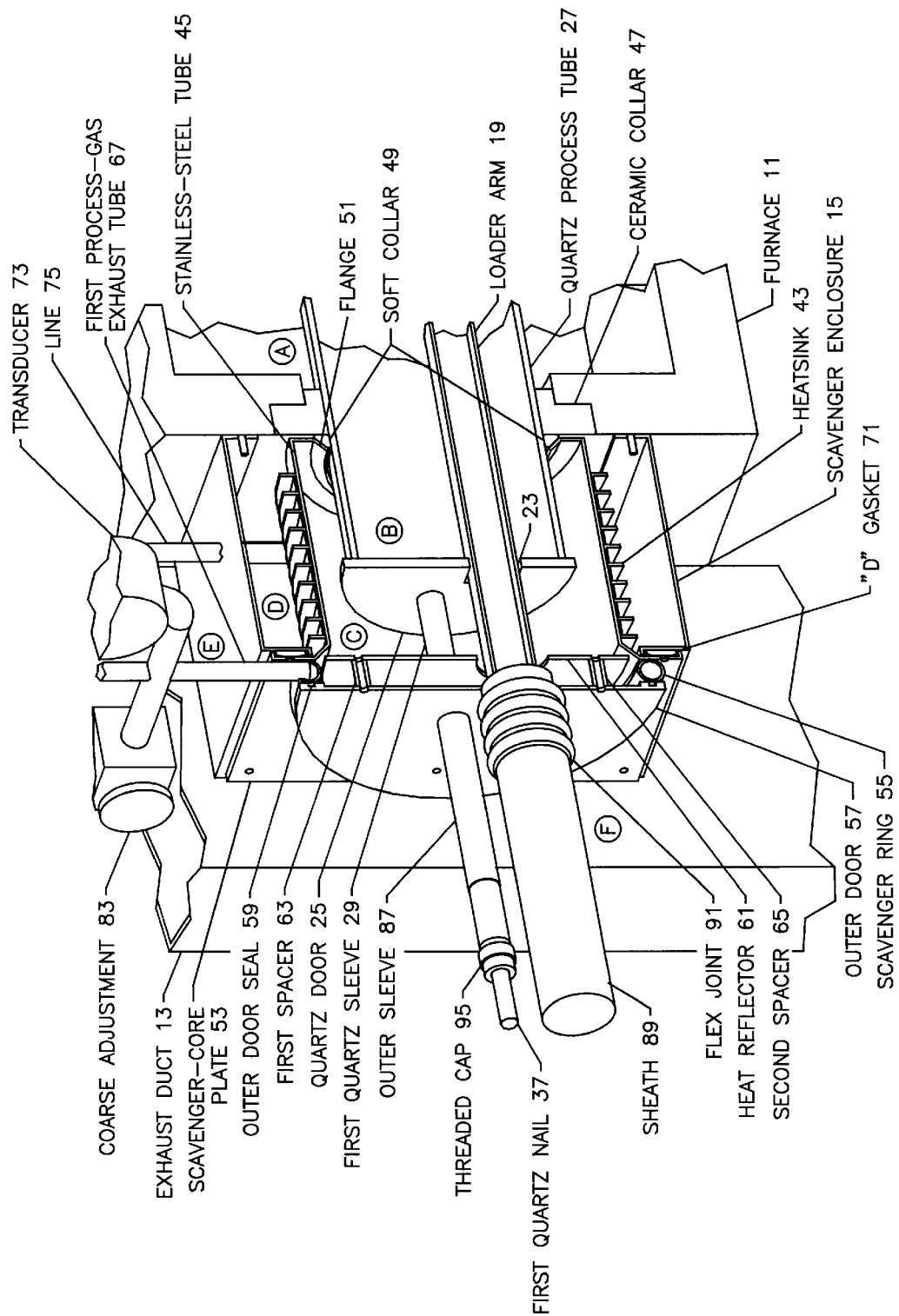
FIG. 3 is a partial sectional view, in perspective, illustrating the aforementioned heat sink encircling the end of a process tube and enclosed within a scavenger enclosure, also showing a loader arm for supporting a charge, such as semiconductor wafers, within the process tube. A loader-arm handle, for controlling the position of the charge within the process tube, may be integrally formed with the loader arm.
Figure 4:
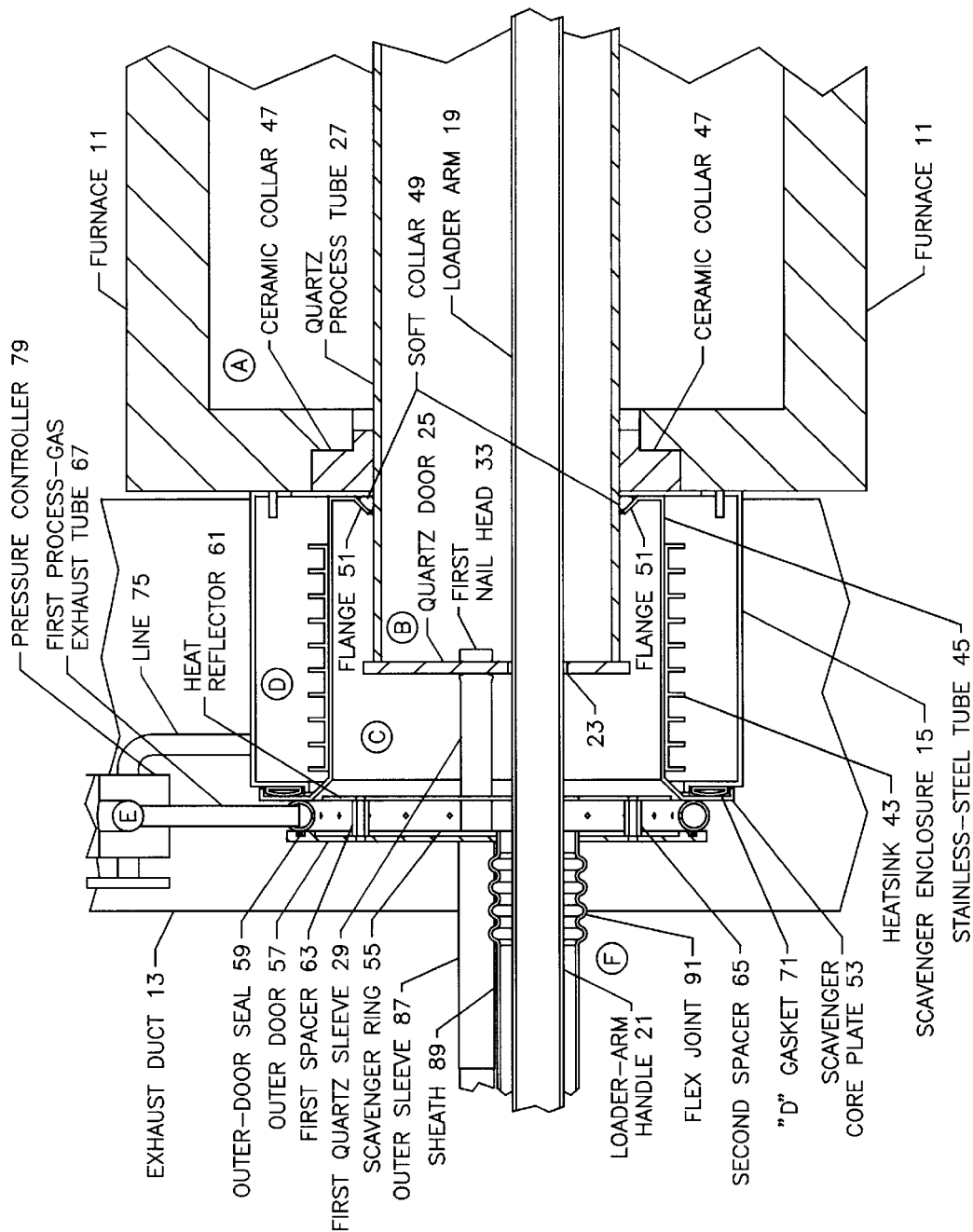
FIG. 4 is a sectional view, in elevation, of the subject matter of FIG. 3, with the addition of additional detail relating to the door which substantially, but non-sealingly, closes the downstream, or exit, portal of the process tube.

As will be observed from FIG. 1 and FIG. 2, scavenger enclosure 15 is essentially a box, having an air inlet 41 communicating with the ambient air of the room in which the furnace and scavenger are housed—preferably a "clean room." The air surrounding the scavenger door should be as pure as possible. As aforementioned, scavenger enclosure 15 is vented through portal 17 to exhaust duct 13. As shown in FIG. 3 and FIG. 4, scavenger enclosure 15 accommodates within it a heat sink 43, which surrounds quartz door 25 and the downstream or exit end of quartz process tube 27. Scavenger enclosure 15 may be constructed of stainless steel, or of other strong and corrosion-resistant sheet material. Heat sink 43, on the other hand, requires somewhat more sophisticated construction. The cylindrical portion of heat sink 43, as illustrated in FIG. 2, may be built around a tube of stainless steel or similar heat-and-corrosion-resistant material. Around the tube may be applied a thin layer of heat-conducting, high-temperature epoxy adhesive as marketed by Omega Engineering Company of Stamford, Connecticut. Bonded to the stainless-steel cylindrical tube by the epoxy adhesive is a finned structure fabricated from a metal extrusion such as "Part 61915" of AAVID Engineering, Inc. of Laconia, N.H. That part is marketed as a flat strip having parallel fins on one side, the fins running parallel to the long dimension of the extrusion. In order to bend the extrusion around the tube, as shown in FIG. 2, it is necessary to slit the fins transversely at equally-spaced intervals, such as two inches, prior to applying the adhesive to the outside of the tube and wrapping the slitted extrusion around it.

Inasmuch as heat sink 43 is an important component of the system in accordance with my invention, it will be worthwhile to give some representative dimensions, while bearing in mind that the dimensions are exemplary only, and may be varied to suit differing requirements for heat dissipation.

For the purpose of further discussion, let us assume that the outer diameter of quartz process tube 27 is seven inches in order to accommodate therewithin semiconductor wafers five inches in diameter. Although the most-commonly-used material for a process tube is fused quartz, there are certain advantages in using instead a process tube of silicon carbide, which has the ability to radiate heat at a rate much higher than quartz. Such a process tube of silicon carbide is within the ambit of my invention. In order to allow some clearance around quartz process tube 27 and quartz door 25, heat sink 43 may be built around a stainless-steel tube 45 having an inner diameter of approximately ten inches, an axial length up to about twelve inches, and a wall thickness of 0.047 inch. Its inner and outer surfaces should be finished to maximize their heat absorptivity and emissivity. The width of finned extrusion according to Part 61915 of AAVID Engineering, Inc. is 7.34 inches. When it has been slitted through the fins (but not the base) into two-inch segments, as described above, and bonded to the outer surface of stainless-steel tube 45 by means of heat-conducting, high-temperature epoxy adhesive, the average thickness of the adhesive may be about 0.06 inch.

Assuming once again for the purpose of illustration that the temperature of the effluent gas just outside quartz door 25 is 300 degrees C., we may also postulate a desired temperature outside heat sink 43 and within scavenger enclosure 15 of 25 degrees C., or slightly higher than normal room temperature. Thus, the temperature drop across the heat sink would have to be about 275 degrees C. The heat input to heat sink 43 is a combination of heat transferred to it from the effluent gas and the heat radiated to it from the portion of quartz process tube 27 within scavenger enclosure 15. The efficiency of heat sink 43 must be sufficient to enable it to dissipate that total heat input while a temperature differential of approximately 275 degrees C. is maintained across it.

The heat input to heat sink 43 from the effluent gas will depend upon the rate of flow of process gas though quartz process tube 27. For the assumed configurations of quartz process tube 27 and scavenger enclosure 15, the rate of heat input to heat sink 43 is about 33 watts if the process-gas flow is five liters per minute. On the other hand, if the process-gas flow is increased to twenty liters per minute, the rate of input to heat sink 43 from the effluent gas goes up to about 130 watts—roughly a linear increase.

Turning now to the heat input to heat sink 43 attributable to the approximately seven inches of process tube within scavenger enclosure 15, we find that about 515 watts of radiated heat power are transferred to heat sink 43 if process tube 27 is indeed made of quartz. On the other hand, if the material of the process tube were silicon carbide rather than quartz, the radiated heat power for the same configuration would increase to slightly more than 1800 watts. The heat emissivity of silicon carbide is much higher than that of quartz.

For the dimensions assumed, heat sink 43 would be able to dissipate to air at 25 degrees C. somewhat in excess of 1800 watts of heat power. This rate of heat dissipation would be more than sufficient for a process tube of quartz. However, if silicon carbide were chosen as the material for the process tube, a designer might decide to increase the fin height, and hence the dissipation capability, of heat sink 43. Instead of using AAVID Part 61915, one might elect to use AAVID Part 65445, which is a thicker material with higher fins, but the same width of 7.34 inches. The overall height of Part 65445 is 1.312 inches, rather than the 0.875 inch overall height of Part 61915. Also, provision could be made for flow of air across the fins.

If one wished to employ a process tube of silicon carbide while retaining the heat-sink material of AAVID Part 61915, this could be done by having process tube 27 extend only six inches, rather than seven inches, into scavenger enclosure 15. In that way, the rate of heat radiated from the process tube to the inner surface of heat sink 43 would be reduced sufficiently to come within the capacity of a heat sink using AAVID Part 61915.

Having assured that the total rate of heat delivered to heat sink 43 by conduction from the effluent gas and by radiation from the process tube is within the capacity of heat sink 43 to dissipate it, we must now consider in more detail the sources of that effluent gas and the specific mode of disposition of the effluent gas as distinguished from the heat content of that gas.

The effluent gas within heat sink 43 is not composed entirely of spent process gas exiting quartz process tube 27 between the mouth of the tube and quartz door 25. The effluent gas has two other constituents. In order to identify them, it must be remembered that quartz process tube 27 is very hot. In all probability, it has electric heating coils (not shown in the drawings) between itself and furnace 11, which is represented schematically as a box with insulated walls. It is not feasible for furnace 11 to make an air-tight seal with the outer surface of quartz process tube 27. Instead, there may be interposed between them a ceramic collar 47, as clearly shown in FIG. 3 and FIG. 4. Ceramic collar 47 fits as tightly as possible both furnace 11 and quartz process tube 27. However, because of the temperature changes in quartz process tube 27 during the cycle of loading, operating, and unloading, a hermetic seal between ceramic collar 47 and quartz process tube 27 will in all probability not be achieved. Thus, if there is any pressure differential between the cavity within furnace 11 and the space within heat sink 43 there will be some small leakage of gas therebetween, despite the presence of ceramic collar 47.

Considerable restraint may be placed upon such leakage by a soft collar 49, held in place by a flange 51 on stainless-steel tube 45. Soft collar 49, bearing against the outer surface of quartz process tube 27, may be composed of heat-resistant material such as Nextel 500, a product of the 3M Company of St. Paul, Minn.

Soft collar 49 also places some restraint upon leakage of gas between flange 51 of stainless-steel tube and the space outside heat sink 43 but within scavenger enclosure 15. But if any substantial pressure difference exists between the space outside heat sink 43 and the space within it, there will be some leakage of gas therebetween, even though it may be very small. Accordingly, as aforementioned, the effluent gas within heat sink 43 may include gas leakage from the cavity within furnace 11 and gas leakage from the space within scavenger enclosure 15, but outside heat sink 43, as well as spent process gas exiting quartz process tube 27 between the mouth of the tube and quartz door 25. There is also a possibility that some spent process gas leaks out of quartz process tube 27 through the holes in quartz door 25 and around first nail head 33 and second nail head 35, and further leaking around the respective ends of first quartz sleeve 29 and second quartz sleeve 31 where they abut the outer face of quartz door 25.

Before proceeding to describe the way in which the aforementioned effluent gas is conveyed away for disposition, it will be worthwhile to identify by capital letters the various spaces within the furnace and scavenger to which reference has been made in the foregoing paragraphs. The capital letters appear in FIG. 4 of the drawings. The spaces mentioned to this point in the specification are as follows:

A. Cavity within furnace 11;
B. Space within quartz process tube 27 near quartz door 25;
C. Space outside quartz door 25 but within heat sink 43 and scavenger enclosure 15; and
D. Space outside heat sink 43 but within scavenger enclosure 15 at portal 17 to exhaust duct 13.

It will be recalled that space D and exhaust duct 13 are occupied by exhaust-duct gas to which heat sink 43 has transferred a major portion of the heat content of the spent process gas in space C. The disposition of the spent process gas will now be explained. Detachably mounted upon scavenger enclosure 15 is a scavenger core plate 53 to which is attached a scavenger ring 55. Scavenger ring 55 is hollow and has spaced-apart perforations facing inward toward the center of the ring whereby to admit spent process gas to the interior of the ring. Completing the surrounding structure is an outer door 57 having holes therein to accommodate loader-arm handle 21 and first quartz sleeve 29 and second quartz sleeve 31, respectively. Set into a circumferential groove near the periphery of outer door 57 is an outer-door seal 59 which bears against scavenger ring 55. Affixed to the inner surface of outer door 57 is a heat reflector 61, which may be supported on outer door 57 by a plurality of spacers (four or more are preferred), of which a first spacer 63 and a second spacer 65 are shown in FIG. 4. In FIG. 5, four spacers, one for each quadrant, are illustrated. Outer door 57 may be of stainless steel, while heat reflector 61 should clearly be of a heat-resistive and reflective material such as polished stainless steel. The spacers may be of quartz or other strong material which is not a good conductor of heat. Outer-door seal 59 may be of silicone rubber or other material capable of making a gas-tight joint.

Connected to scavenger ring 55 is a first process-gas-exhaust tube 67, which leads away from scavenger enclosure 15 to a junction 69, which has sufficient importance that the space within it will hereinafter be identified by the capital letter "E" and added to the sequence A though D enumerated above. Loader-arm handle 21, which is to be manipulated by the operator of the scavenger system, extends into the room which accommodates the furnace and scavenger. In view of the importance of minimizing contamination of the semiconductor charge by any impurity that may "back diffuse" into quartz process tube 27, the aforementioned room should be a "clean room." Accordingly, the space and pressure within the clean room will be designated by the capital letter "F." Thus, we have the following additional definitions:

E. Space within junction 69; and
F. Space within clean room, into which loader-arm handle 21 extends.

If scavenger ring 55 is successfully to collect spent process gas from space C and convey it through first process-gas-exhaust tube 67 to junction 69, then clearly the pressure at space E must be lower than the pressure at space C. In order to minimize back diffusion into quartz process tube 27, the pressure at space C must be slightly lower than the pressure at space B. But, as has already been noted, the pressure at space C is to some degree a function of the respective pressures at space A and space D by virtue of gas leakage which may take place through soft collar 49. Moreover, the pressure at space B is a function of the gas inputs to quartz process tube 27. And the pressure at space D is a function of the pressure in exhaust duct 13.

Inasmuch as the pressure in space B near the mouth of quartz process tube 27 depends upon the pressures of the gases carrying the "impurities" used in processing the semiconductor material, the pressure at space B may be beyond the control of the operator of the scavenger. Likewise, as has already been explained, exhaust duct 13 may be a part of a large-scale ventilation system in the semiconductor-fabricating facility. Therefore, the pressure at space D may not be within the control of the operator of the scavenger. Consequently, it becomes apparent that something must be done to control independently the pressure at space E within junction 69, and thus indirectly to get control over the respective pressures at space C and space D. The following paragraphs will indicate how this control is achieved in accordance with my invention.

It is worth re-stating that a primary goal of this system is to separate the disposition of heat from the disposition of the spent process gas, which is presumed to be contaminated by the often-poisonous "impurities" used in processing the semiconductor material. Thus the exhaust-duct gas which enters exhaust duct 13 should contain none of the contaminants present in the spent process gas exiting quartz process tube 27. We have observed that soft collar 49 is at least slightly permeable to these gases. Therefore, to maintain this separation, the pressure at space D must be higher than the pressure at space C, which should, in turn, be just slightly lower than the pressure at space B. But the higher the pressure at space D with respect to the pressure at space C, the more air and other gas from exhaust duct 13 may be forced through soft collar 49 into space C and find its way, by back diffusion through the gap between quartz process tube 27 and quartz door 25, into the process tube, where it may contaminate the semiconductor material. Once again, the concentration of oxygen molecules within the central part of quartz process tube 27 is a measure of that back diffusion.

In FIG. 8, the concentration of oxygen is plotted as a function of the volume rate of flow of process-gas exhaust, for each of two different volume rates of flow of process gas. The rates of flow of process-gas exhaust are at all times higher than the rates of flow of process gas. In order to satisfy the law of continuity, the process gas must be augmented by some other gas before the augmented mixture is exhausted. And that augmentation takes place at junction 69. Up to this point in the specification, the pressure within junction 69 has been referred to as "the pressure at space E." Now that it has become apparent that the gas augmentation which takes place at junction 69 is in the nature of a controlled augmentation, it will be appropriate to introduce a further new term—"exhaust control pressure." The definition of exhaust control pressure is the pressure within junction 69 relative to the pressure at portal 17, outside heat sink 43 but within scavenger enclosure 15.

In order fully to understand "exhaust control pressure," it will be necessary to introduce several more structural components. First, interposed between scavenger core plate 53 and scavenger enclosure 15 is a gasket 71, sometimes referred to as a "D" gasket. Gasket 71 serves to seal space D against automatic equalization with the pressure in space F, the clean room. It can be made of rubber or any other suitable non-porous material. Second, installed adjacent junction 69 or connected to it by way of a short tube is a transducer 73. Transducer 73 is also connected via a line 75 through a top wall of scavenger enclosure 15 to space D, within scavenger enclosure 15. Transducer 73 is adapted to measure the exhaust control pressure, or pressure differential between junction 69 and portal 17, the opening between scavenger enclosure 15 and exhaust duct 13. A signal wire 77 connects transducer 73 with a pressure controller 79 mounted on an input line 81 communicating with junction 69. Input line 81 is connected to a source, such as a tank, (not shown) of air, nitrogen, or other inert gas.

Third, junction 69 is coupled through a coarse adjustment 83, or damper, to a second process-gas-exhaust tube 85, which runs to a dedicated effluent-management system (not shown) which can permanently dispose of noxious gases. It will be recalled that the separation of this function from the disposition of process-gas heat content is one of the important objectives of this invention.

The purpose of bringing makeup air or inert gas through pressure controller 79 to junction 69 is to raise the pressure at junction 69 and hence, through first process-gas-exhaust tube 67, also within scavenger ring 55 and space C. This increase in pressure within the process-gas-exhaust system is very small and must be carefully controlled by pressure controller 79. The reason for artificially increasing the pressure within the process-gas-exhaust system will now be explained.

From the discussion contained in the foregoing paragraphs, it can be deduced that the pressures in the respective spaces as they have been defined must be related by the following expression of inequality:

E<C<D<B

But the pressure in space C, outside quartz door 25, must not be much lower than the pressure in space B, just inside that door. Otherwise, the slow flow of spent process gas outward through the tiny gap between quartz door 25 and quartz process tube 27 would become turbulent, and the back diffusion from space C to space B through that gap would become unacceptably high. Therefore, if the pressure in space C must be only slightly lower than the pressure in space B, then the respective pressures in spaces B, C, and D must all be very close together. Furthermore, if the pressure in space C is much lower than the pressure in space D, too much exhaust-duct gas from space D will be driven through the pores of soft collar 49 into space C, where it will become available to back diffuse into quartz process tube 27—an undesirable consequence.

Figure 9:
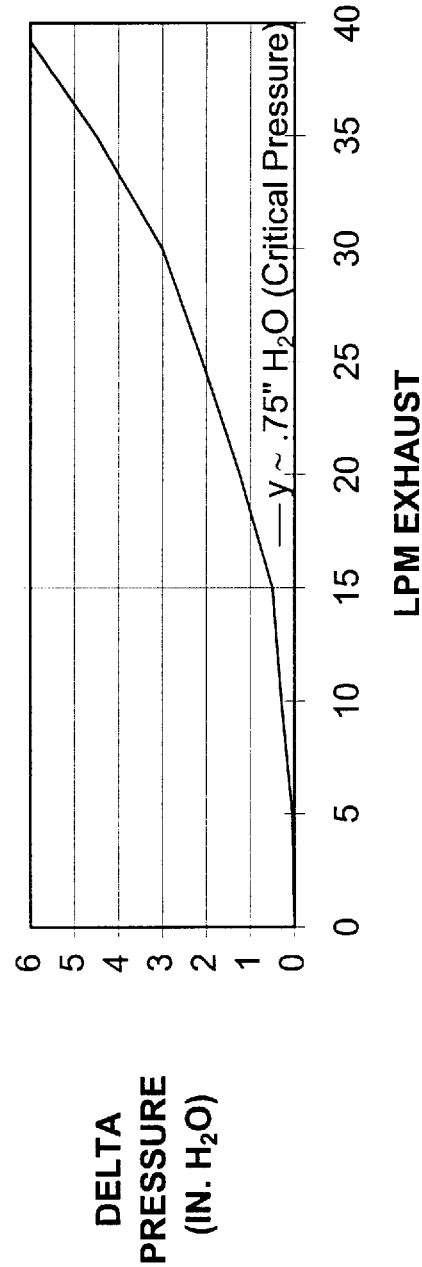
FIG. 9 is a plot of pressure differential between exhaust-duct gas and process-gas exhaust, as a function of volume rate of flow of process-gas-exhaust in the same typical configuration of scavenger system.

Having shown that the respective pressures in spaces B, C, and D must all be very close together, the next matter to be resolved is the relative pressure between space E (in junction 69) and the closely related pressures in spaces B, C, and D respectively. It will be recalled that the "exhaust control pressure" has been defined, in effect, as the pressure in space E relative to the pressure in space D, and transducer 73 has been provided in order to measure continuously that relative pressure. In making my invention, I have discovered that the exhaust control pressure is an important determinant of the successful—or unsuccessful—operation of the scavenger system which has been described in the foregoing paragraphs. FIG. 8 and FIG. 9 of the drawings illustrate the performance of the scavenger system for various values of exhaust control pressure and for two different rates of process gas flow through quartz process tube 27. Once again, the success of the scavenger system is to be measured by the concentration (or absence) of oxygen within the process tube at or near its midpoint.

Referring first to FIG. 8, it is immediately apparent that the concentration of oxygen is almost negligible—and the success of the scavenger system is almost complete—if the rate of process-gas exhaust (through second process-gas-exhaust tube 85) is kept below about fifteen liters per minute. This is true whether the rate of flow of process gas through quartz process tube 27 is five liters per minute or ten liters per minute. This fact indicates that the rate of flow of makeup air, nitrogen, or other inert gas into junction 69 through input line 81 must be kept very low—probably below about ten liters per minute. On the other hand, the rate of flow of such makeup air or other gas must be sufficient to prevent the pressure at space E (within junction 69) from falling too far below the pressure in space D as the pressure in exhaust duct 13 varies from time to time. It will be recalled that the exhaust duct must be considered to be a part of the processing facility over which it is not practical to maintain any close control.

I have discovered that, as illustrated in FIG. 9 of the drawings, for the rate of flow of makeup air or other gas to be sufficiently low to prevent appreciable back diffusion into quartz process tube 27, the exhaust control pressure should be kept below about 0.75 inch of water for the configuration of scavenger system which has been described so far in this specification. That is to say, the absolute pressure at space E (within junction 69) should be lower than the absolute pressure at space D, but not lower by more than about 0.75 inch of water. If the exhaust control pressure is allowed to become higher than about 0.75 inch of water, back diffusion into quartz process tube 27 will begin to become significant, whether the rate of flow of process gas is five liters per minute or ten liters per minute or some other value.

The source of gas for input line 81 may be a small blower in the clean room or a pressurized tank of nitrogen or other inert gas. Pressure controller 79, in series with input line 81, may be of a type such as Model 5866, marketed by Brooks Instrument Company of Hatfield, Pa.

The purpose of coarse adjustment 83 is to restrict the flow of process gas through second process-gas exhaust tube 85. Inasmuch as the pressure in second process-gas exhaust tube 85, like the pressure in exhaust duct 13, is dependent upon the functions of the processing facility, it is not under the direct control of the operator of the scavenger. Coarse adjustment 83 serves to limit the flow of process gas through second process-gas exhaust tube 85. In order to stay within the desired operating range to the left of the dash line in FIG. 8 and FIG. 9 of the drawings, the flow of process-gas exhaust through second process-gas exhaust tube 85 should be limited to a level equal to the maximum rate of flow of gas through pressure controller 79.

Once again, the gas which passes outward through coarse adjustment 83 and second process-gas-exhaust tube 85 to a suitable sink for permanent disposition has three components, as follows:

1. Noxious spent process gas from quartz process tube 27;
2. Gas which leaks through soft collar 49 into space C; and
3. Makeup air or other gas introduced to junction 69 through input line 81.

The only one of these components which can be independently controlled is the makeup air or other gas. The rate of flow of exhaust gas through second process-gas exhaust tube 85 is roughly set by means of coarse adjustment 83 and the augmentation, but the means for fine control of the all-important exhaust control pressure is pressure controller 79, acting in response to a signal from transducer 73.

Figure 6:
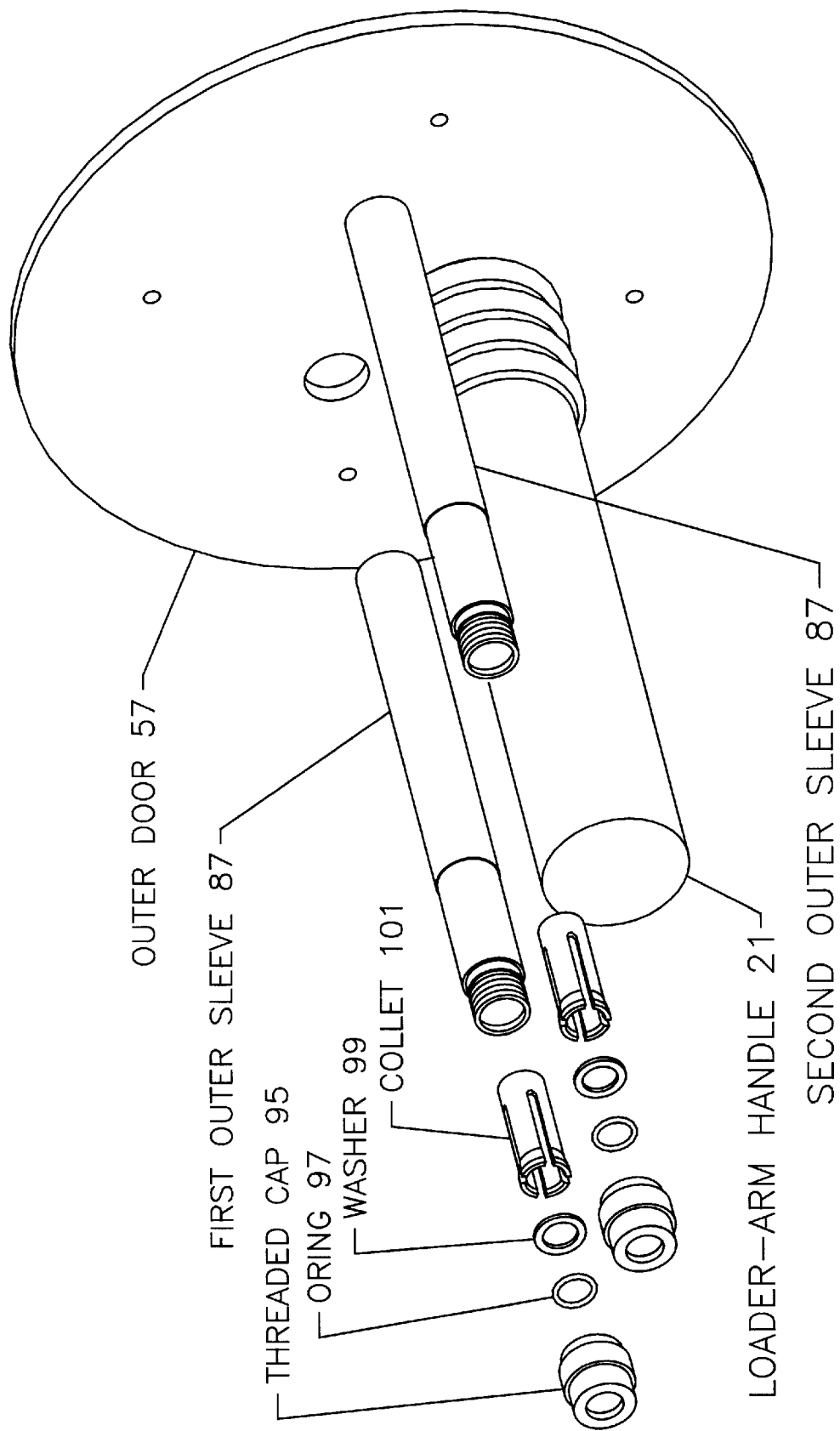
FIG. 6 is an exploded perspective view, in detail, of the portion of the sub-assembly of FIG. 5 which permits the operator of the scavenger system to control it.

The scavenger system in accordance with my invention has a few other components which have not yet been introduced and described. They are as follows:

Outer door 57 has associated with it an outer sleeve 87 which surrounds first quartz nail 37 or second quartz nail 39 and one end of which also abuts the outer face of outer door 57 in order to seat it against scavenger ring 55. Controlled withdrawal of outer sleeve 87 also withdraws outer door 57 from contact (through outer door seal 59) with scavenger ring 55. Surrounding loader-arm handle 21 is a sheath 89, which, acting through a flex joint 91, exerts force on outer door 57 and on scavenger ring 55. The outer end of each of the outer sleeves 87 surrounding a quartz nail 37 or 39 is secured by a clamp 93 comprising a threaded cap 95, an O-ring 97, a washer 99, and a collet 101, as clearly shown in the exploded views of FIG. 5 and FIG. 6 of the drawings.

Although a full disclosure and discussion of all the aspects of the apparatus and operation thereof in accordance with the present invention have been presented in the foregoing paragraphs, it is possible that certain variations thereof may be made in the future without departing from the scope of this invention. Accordingly, the scope of the invention is defined in the following claims, which cover the elements of my invention and equivalents thereof.

I claim:

1. A scavenger system for separately disposing of effluent gas and a major portion of the heat content of said effluent gas, said scavenger system comprising:

(a) a process tube having an opening and producing effluent gas, (b) first door means for non-sealingly closing said opening while allowing some passage of effluent gas out of said process tube, thereby defining with said process tube a first non-sealed space for process gas, (c) heat-exchanger means outside said process tube and said opening, said heat-exchanger means having an inner surface and an outer surface, said inner surface defining with said process tube and said first door means a second non-sealed space for receiving effluent gas, (d) a scavenger enclosure surrounding said heat-exchanger means and defining with said outer surface of said heat-exchanger means a third non-sealed space for gas whereby gas in said third non-sealed space may receive heat by radiation and conduction from said outer surface of said heat-exchanger means, (e) heat-disposition means for receiving heated gas from said third non-sealed space and for conducting said heated gas away from said scavenger system for disposition of said heat, (f) an effluent-gas-receiving structure having pores facing said second non-sealed space for receiving effluent gas, and having first exhaust means coupled thereto for conducting effluent gas away from said effluent-gas-receiving structure, and (g) pressure-control means for sensing the pressure of effluent gas leaving said first exhaust means, comparing said pressure of said effluent gas with the pressure of said heated gas in said third non-sealed space, and for maintaining said pressure of said effluent gas a predetermined amount below said pressure of said heated gas in said third non-sealed space.

2. A scavenger system in accordance with claim 1, further including second door means sealingly engaged with said effluent-gas-receiving structure for closing said second non-sealed space for receiving effluent gas.

3. A scavenger system in accordance with claim 2 in which a heat reflector is attached to said second door means on the side toward said first door means.

4. A scavenger system in accordance with claim 3 in which said heat reflector is spaced from said second door means.

5. A scavenger system in accordance with claim 3 in which said heat reflector is made of polished metal.

6. A scavenger system in accordance with claim 2, further including means for manually positioning said second door means either for closing said second non-sealed space for receiving effluent gas or in a withdrawn position whereby to allow access to said first door means and to the interior of said process tube.

7. A scavenger system in accordance with claim 2, further including a loader arm for reception within said process tube and a handle attached to said loader arm, said handle being suitably sized to penetrate openings through said first door means and said second door means respectively.

8. A scavenger system in accordance with claim 1 in which said pressure-control means includes means for adding extrinsic gas to said effluent gas leaving said first exhaust means in order to maintain its pressure a predetermined amount below said pressure of said heated gas in said third non-sealed space.

9. A scavenger system in accordance with claim 8 in which said means for adding extrinsic gas includes a tank of pressurized inert gas.

10. A scavenger system in accordance with claim 8 in which said means for adding extrinsic gas includes a blower having the atmosphere as its input.

11. A scavenger system in accordance with claim 1 in which said scavenger enclosure is made of corrosion-resistant metal.

12. A scavenger system in accordance with claim 1 in which said scavenger enclosure has a flange which embraces the periphery of said process tube and makes porous contact therewith.

13. A scavenger system in accordance with claim 1 in which said pressure-control means insures that said effluent gas flows into said effluent-gas-receiving structure rather than into said heat-disposition means.

14. A scavenger system in accordance with claim 1 in which said pressure of said effluent gas is maintained below said pressure of said heated gas in said third non-sealed space by an amount equal to or less than 0.75 inch of water.

15. A scavenger system in accordance with claim 1 in which back diffusion of gas from said second non-sealed space into said first non-sealed space is minimized.

16. A scavenger system in accordance with claim 1 in which turbulence of said effluent gas passing out of said process tube is minimized.

17. A scavenger system in accordance with claim 1 in which porous contact is made between said first door means and said opening of said process tube.

18. A scavenger system in accordance with claim 1 in which said process tube is made of quartz.

19. A scavenger system in accordance with claim 1 in which said process tube is made of silicon carbide.

20. A scavenger system in accordance with claim 1 in which said heat-exchanger means comprises a metallic tube having an inner surface and an outer surface, and a finned structure wrapped around said metallic tube and bonded to the outer surface thereof by a layer of heat-conducting adhesive.

21. A scavenger system in accordance with claim 20 in which said finned structure is a metal extrusion.

22. A scavenger system in accordance with claim 20 in which said heat-conducting adhesive is a high-temperature epoxy material.

23. A scavenger system in accordance with claim 20 in which the finned structure of said heat-exchanger means is partially slitted transversely to said fins at approximately equal intervals around said outer surface of said metallic tube.

24. A scavenger system in accordance with claim 1 in which said effluent-gas-receiving structure comprises a hollow metallic ring and in which said pores comprise perforations formed in the wall of said hollow metallic ring.

25. A scavenger system in accordance with claim 1 in which said pressure-control means includes a transducer for continuously sensing the difference between said pressure of said effluent gas and said pressure of said heated gas in said third non-sealed space.

26. A scavenger system in accordance with claim 1 in which said pressure-control means includes a damper for restricting the flow of process gas away from said effluent-gas-receiving structure.

27. A scavenger system in accordance with claim 1, further including means for manually positioning said first door means either for non-sealing closure of said opening of said process tube or in a withdrawn position whereby to allow access through said opening to the interior of said process tube.

* * * * *